(12) United States Patent
Xie et al.

(10) Patent No.: US 11,448,436 B2
(45) Date of Patent: Sep. 20, 2022

(54) METHOD OF FORMING ELECTRODES ON ELECTROCALORIC FILM

(71) Applicant: UNITED TECHNOLOGIES CORPORATION, Hartford, CT (US)

(72) Inventors: Wei Xie, East Hartford, CT (US); Subramanyaravi Annapragada, Shrewsbury, MA (US); Joseph V. Mantese, Ellington, CT (US); Parmesh Verma, South Windsor, CT (US); Thomas D. Radcliff, Vernon, CT (US); William A. Rioux, Willington, CT (US)

(73) Assignee: UNITED TECHNOLOGIES CORPORATION, Hartford, CT (US)

( * ) Notice: Subject to any disclaimer, the term of this patent is extended or adjusted under 35 U.S.C. 154(b) by 297 days.

(21) Appl. No.: 16/064,812

(22) PCT Filed: Dec. 21, 2015

(86) PCT No.: PCT/US2015/067191
§ 371 (c)(1),
(2) Date: Jun. 21, 2018

(87) PCT Pub. No.: WO2017/111921
PCT Pub. Date: Jun. 29, 2017

(65) Prior Publication Data
US 2018/0375008 A1 Dec. 27, 2018

(51) Int. Cl.
| | | |
|---|---|---|
| *F25B 21/00* | (2006.01) | |
| *F25B 41/20* | (2021.01) | |
| *H01L 37/02* | (2006.01) | |
| *F25B 49/00* | (2006.01) | |
| *F25B 49/02* | (2006.01) | |
| *C08F 214/22* | (2006.01) | |

(52) U.S. Cl.
CPC ............. *F25B 41/20* (2021.01); *F25B 21/00* (2013.01); *F25B 49/00* (2013.01); *F25B 49/02* (2013.01); *H01L 37/02* (2013.01); *H01L 37/025* (2013.01); *C08F 214/22* (2013.01); *F25B 2321/001* (2013.01)

(58) Field of Classification Search
CPC .. H01L 37/02; H01L 37/025; F25B 2321/001; F25B 21/00; F25B 41/04; F25B 49/00; F25B 49/02
See application file for complete search history.

(56) References Cited

U.S. PATENT DOCUMENTS

| | | | | |
|---|---|---|---|---|
| 8,769,967 B2 * | 7/2014 | Kruglick | ................. | F25B 21/00 62/3.3 |
| 8,869,542 B2 * | 10/2014 | Zhang | ..................... | F25B 21/00 62/3.1 |
| 10,342,889 B1 * | 7/2019 | Fladoos | ................... | A61L 15/12 |
| 2001/0050391 A1 * | 12/2001 | Matsuno | ................ | H01L 28/60 257/306 |
| 2003/0019515 A1 * | 1/2003 | Fritzche | ................... | E04H 15/20 135/121 |
| 2003/0162307 A1 * | 8/2003 | Lafferty | ............. | B01L 3/50851 436/518 |
| 2009/0084442 A1 * | 4/2009 | Naito | ..................... | H01L 51/447 136/263 |
| 2011/0309463 A1 * | 12/2011 | Kruglick | ................. | H01L 37/02 257/467 |
| 2012/0126227 A1 * | 5/2012 | Maeda | ................ | H01L 29/7869 257/43 |
| 2012/0326243 A1 * | 12/2012 | Huang | ................... | H01L 29/517 257/410 |
| 2014/0036449 A1 * | 2/2014 | Defay | ................... | H01L 23/345 361/700 |
| 2014/0230453 A1 * | 8/2014 | Kruglick | ................. | F25B 21/00 62/3.1 |
| 2014/0345296 A1 * | 11/2014 | Defay | ..................... | F25B 21/00 62/3.1 |

(Continued)

FOREIGN PATENT DOCUMENTS

| | | | | |
|---|---|---|---|---|
| JP | 2015130485 A | 7/2015 | | |
| WO | WO 2007/099279 A1 * | 9/2007 | ............. | H01L 37/02 |

(Continued)

OTHER PUBLICATIONS

Mischenko, A.S., et al., "Giant Electrocaloric Effect in Thin-Film PbZr0.95Ti0.05O3". Science, vol. 311, (5765), Mar. 3, 2006, pp. 1270-1271.*

(Continued)

*Primary Examiner* — Bret P Chen
(74) *Attorney, Agent, or Firm* — Cantor Colburn LLP

(57) ABSTRACT

A method of making an electrocaloric element includes forming conductive layers on opposing surfaces of a film comprising an electrocaloric material to form an electrocaloric element, wherein the forming of the conductive layers includes one or more of: vapor deposition of the conductive layers under reduced pressure for a duration of time, wherein the duration of time under reduced pressure is less than 240 minutes; vapor deposition of the conductive layers under reduced pressure for a duration of time, wherein the duration of time of exposure to conductive material deposition is less than 240 minutes; vapor deposition of the conductive layers under reduced pressure, wherein the reduced pressure is $10^{-8}$ torr to 500 torr; or maintaining the film at a temperature of less than or equal to 200° C. during forming of the conductive layers.

12 Claims, 1 Drawing Sheet

(56) References Cited

U.S. PATENT DOCUMENTS

| | | | | |
|---|---|---|---|---|
| 2015/0024231 A1* | 1/2015 | Kutsumizu | ............ | C23C 28/00 428/596 |
| 2015/0053086 A1* | 2/2015 | Rebouillat | ............ | B01D 53/22 96/11 |
| 2015/0082809 A1* | 3/2015 | Schwartz | ............... | F25B 21/00 62/3.1 |
| 2015/0155467 A1* | 6/2015 | Kaneko | ............... | H01J 29/458 62/3.1 |
| 2017/0030611 A1* | 2/2017 | Radcliff | ................. | F25B 21/00 |
| 2017/0043600 A1* | 2/2017 | Abbott, Jr. | ............ | B41J 29/377 |
| 2017/0120419 A1* | 5/2017 | Li | ........................ | B24B 55/02 |
| 2018/0363956 A1* | 12/2018 | Eastman | .................. | B60H 1/32 |
| 2019/0248708 A1* | 8/2019 | Zhang | ................... | C25D 11/18 |
| 2020/0309421 A1* | 10/2020 | Xie | ........................ | F25B 21/00 |
| 2021/0140686 A1* | 5/2021 | Mantese | ................ | F25B 21/00 |
| 2021/0180838 A1* | 6/2021 | Eastman | ................ | F25B 49/00 |
| 2022/0074631 A1* | 3/2022 | Pei | ........................ | F28D 15/00 |

FOREIGN PATENT DOCUMENTS

| | | | | |
|---|---|---|---|---|
| WO | WO 2011/075335 A1 * | 6/2011 | ............ | F25B 21/00 |
| WO | 2015156794 A1 | 10/2015 | | |
| WO | WO 2015/156794 | * 10/2015 | ............... | F25B 9/14 |
| WO | WO 2015/156794 A1 * | 10/2015 | ............... | F25B 9/14 |
| WO | WO 2015/167529 A1 * | 11/2015 | ............ | F25B 21/02 |
| WO | 2017030529 A1 | 2/2017 | | |
| WO | WO 2017.030529 A1 * | 2/2017 | ............ | F25B 21/00 |

OTHER PUBLICATIONS

Chen, Hao, et al., "Giant electrocaloric effect in lead-free thin film of strontium bismuth tantalite". Appl. Phys. Lett. 94, 182902 (2009), pp. 1-3. https://doi.org/10.1063/1.3123817.*

Cao, Hai-Xia, et al., "Electrocaloric effect in BaTiO3 thin films". J. Appl. Phys. 106, 094104 (2009), pp. 1-5. https://doi.org/10.1063/1.3253736.*

Saranya, D., et al., "Electrocaloric effect of PMN-PT thin films near morphotropic phase boundary". Bull. Mater. Sci., vol. 32, No. 3, Jun. 2009, pp. 259-262.*

Neese, Bret, et al., "Large Electrocaloric Effect in Ferroelectric Polymers Near Room Temperature". Science, vol. 321, Aug. 8, 2008, pp. 821-823. DOI: 10.1126/science.1159655.*

Moreira, R.L., et al., "Electrocaloric effect in low-crystallinity ferroelectric polymers". Appl. Phys. Lett. 100, 152901 (2012) pp. 1-5; https://doi.org/10.1063/1.3702781.*

Kutnjak, Zdravko, et al., "Electrocaloric Effect: Theory, Measurements, and Applications". J. Webster (ed.), Wiley Encyclopedia of Electrical and Electronics Engineering. 2015, pp. 1-19.*

Lu, S.-G., et al., "15—The electrocaloric effect (ECE) in ferroelectric polymer films," Editor(s): Zexian Cao, In Woodhead Publishing Series in Electronic and Optical Materials, Thin Film Growth, Woodhead Publishing, 2011, pp. 364-383.*

Feng, Zuyong, et al., "Large electrocaloric effect in highly (001)-oriented 0.67PbMg1/3Nb2/3O3-0.33PbTiO3 thin films". Solid State Communications 151 (2011) 123-126.*

Kleiner, A., et al., "Reactively Sputtered PMN-PT Thin Films for Electrocaloric Applications". 2014 Joint IEEE International Symposium on the Applications of Ferroelectric, International Workshop on Acoustic Transduction Materials and Devices & Workshop on Piezoresponse Force Microscopy, 2014, pp. 1-4, doi: 10.11.*

Evans, G., et al., "A Numerical Model of the Flow and Heat Transfer in a Rotating Disk Chemical Vapor Deposition Reactor". Journal of Heat Transfer, vol. 109, Nov. 1987, pp. 928-935.*

Suchaneck, G., et al., "Materials and device concepts for electrocaloric refrigeration". Physica Scripta, 90 (2015) 09420, pp. 1-6.*

DebRoy, T., et al., "Role of heat transfer and fluid flow in the chemical vapor deposition of diamond". Journal of Applied Physics 68, 2424 (1990); 1 page. Abstract Only https://doi.org/10.1063/1.346502.*

Zhang, Guangzu, et al., "Colossal Room-Temperature Electrocaloric Effect in Ferroelectric Polymer Nanocomposites Using Nanostructured Barium Strontium Titanates". ACS Nano, vol. 9, No. 7, 2015, 7164-7174.*

Liu, Hongbo, et al., "Colossal Room-Temperature Electrocaloric Effect in Ferroelectric Polymer Nanocomposites Using Nanostructured Barium Strontium Titanates". Chin. Phys. B, vol. 29, No. 8 (2020) 087701, pp. 1-3.*

European Office Action in European Application No. 15826104.0 dated Jul. 9, 2019; 5 Pages.

Chinese Office Action for Application No. 201580085488.5; dated Jul. 20, 2021; 7 Pages.

\* cited by examiner

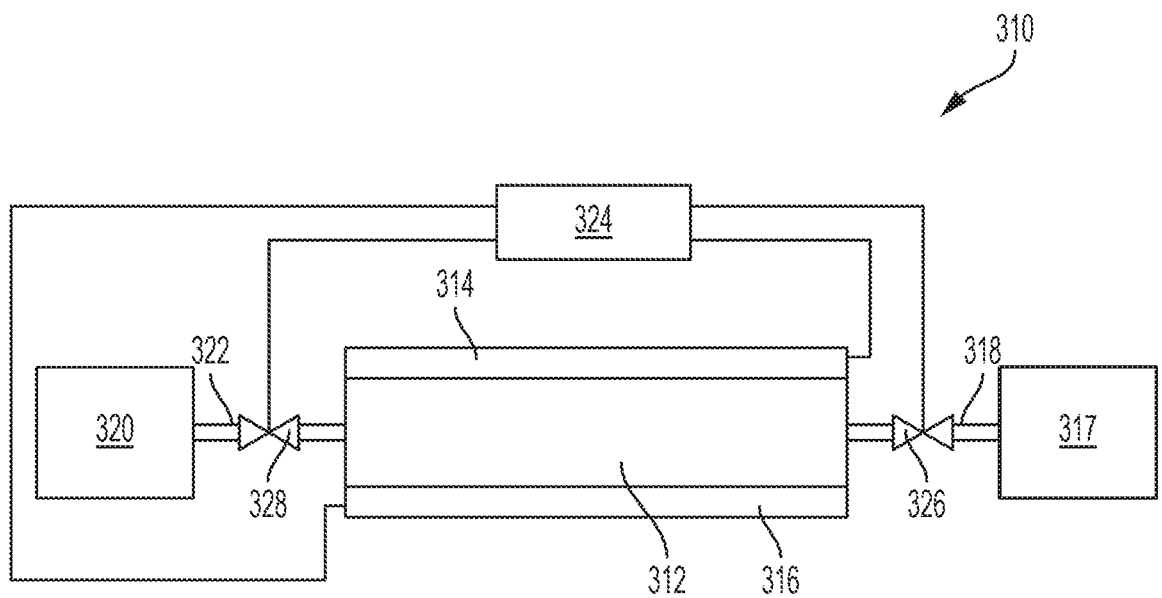

METHOD OF FORMING ELECTRODES ON ELECTROCALORIC FILM

CROSS REFERENCE TO RELATED APPLICATIONS

This application is a National Stage application of PCT/US2015/067191, filed Dec. 21, 2015, which is incorporated by reference in its entirety herein.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that comprises a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops. Various technologies have been proposed such as field-active heat or electric current-responsive heat transfer systems relying on materials such as electrocaloric materials, magnetocaloric materials, or thermoelectric materials. However, many proposals have been configured as bench-scale demonstrations with limited capabilities for scalability or mass production.

Electrocaloric films have been proposed for use in heat transfer systems. However, they are subject to a number of potential problems when fabricated in very thin film systems in an effort to achieve performance parameters, such as temperature lift comparable to conventional vapor compression heat transfer systems. One area of concern is the application of electrode materials onto an electrocaloric film, which can adversely impact electrocaloric properties or mechanical properties in thin electrocaloric polymer films or other electrocaloric materials.

BRIEF DESCRIPTION

In some embodiments, a method of making a heat transfer system comprises forming conductive layers on opposing surfaces of a film comprising an electrocaloric material to form an electrocaloric element, wherein the forming of the conductive layers includes one or more of:

vapor deposition of the conductive layers under reduced pressure for a duration of time, wherein the duration of time under reduced pressure is less than 240 minutes;

vapor deposition of the conductive layers under reduced pressure for a duration of time, wherein the duration of time of exposure to conductive material deposition is less than 240 minutes;

vapor deposition of the conductive layers under reduced pressure, wherein the reduced pressure is $10^{-8}$ torr to 500 torr; or maintaining the film at a temperature of less than or equal to 200° C. during forming of the conductive layers.

Also, a fluid flow path is provided between the electrocaloric element and a heat source or a heat sink for controlled heat transfer between the electrocaloric element and the heat source or heat sink.

In some embodiments, a method of making an electrocaloric element comprises forming conductive layers on opposing surfaces of a film comprising an electrocaloric material to form an electrocaloric element, wherein the forming of the conductive layers includes one or more of:

vapor deposition of the conductive layers under reduced pressure for a duration of time, wherein the duration of time under reduced pressure is less than 240 minutes;

vapor deposition of the conductive layers under reduced pressure for a duration of time, wherein the duration of time of exposure to conductive material deposition is less than 240 minutes;

vapor deposition of the conductive layers under reduced pressure, wherein the reduced pressure is $10^{-8}$ torr to 500 torr; or maintaining the film at a temperature of less than or equal to 100° C. during forming of the conductive layers.

In any of the foregoing embodiments, the forming of the conductive layers comprises vapor deposition of the conductive layers under reduced pressure for a duration of time, wherein the duration of time under reduced pressure is less than 240 minutes.

In any of the foregoing embodiments, the duration of time under reduced pressure is less than 30 minutes.

In any of the foregoing embodiments, the duration of time under reduced pressure is less than 10 minutes.

In any of the foregoing embodiments, the duration of time under reduced pressure is at least 1 millisecond.

The method of any of claims 1-6, wherein the forming of the conductive layers comprises vapor deposition of the conductive layers under reduced pressure for a duration of time, wherein the duration of time of exposure to conductive material deposition is less than 240 minutes.

In any of the foregoing embodiments, the duration of time of exposure to conductive material deposition is less than 30 minutes.

In any of the foregoing embodiments, the duration of time of exposure to conductive material deposition is less than 10 minutes.

In any of the foregoing embodiments, the duration of time of exposure to conductive material deposition is at least 1 millisecond.

In any of the foregoing embodiments, the forming of the conductive layers comprises vapor deposition of the conductive layers under reduced pressure, wherein the reduced pressure is $10^{-8}$ torr to 500 torr.

In any of the foregoing embodiments, the reduced pressure is at least $10^{-7}$ torr.

In any of the foregoing embodiments, the reduced pressure at least $10^{-6}$ torr.

In any of the foregoing embodiments, the reduced pressure is less than 200 torr.

In any of the foregoing embodiments, the reduced pressure is less than 100 torr.

In any of the foregoing embodiments, the film is maintained at a temperature of less than or equal to 200° C. during forming of the conductive layers.

In any of the foregoing embodiments, the film is maintained at a temperature of less than or equal to 100° C. during forming of the conductive layers.

In any of the foregoing embodiments, the film is maintained at a temperature of less than or equal to 50° C. during forming of the conductive layers.

In any of the foregoing embodiments, the film is maintained at a temperature of less than or equal to 20° C. during forming of the conductive layers.

In any of the foregoing embodiments where film temperature is maintained at a temperature of less than or equal to 200° C. during forming of the conductive layers, the forming of the conductive layers can be by other than vapor deposition.

In any of the foregoing embodiments, the forming of the conductive layers comprises vapor deposition of the conductive layers comprising aluminum or alloys of aluminum at least one other metal comprising silicon, chromium, or titanium.

In any of the foregoing embodiments, the film is in thermal contact with a heat sink during forming of the conductive layers.

In any of the foregoing embodiments, the electrocaloric material comprises an electrocaloric polymer.

In some embodiments, an electrocaloric element is formed by a method according to any of the above embodiments.

In some embodiments, a heat transfer system comprises an electrocaloric element formed by the method of any of the above embodiments, a first thermal flow path between the electrocaloric element and a heat sink, a second thermal flow path between the electrocaloric element and a heat source, and a controller configured to control electrical current to the conductive layers and to selectively direct transfer of heat energy from the electrocaloric element to the heat sink along the first thermal flow path or from the heat source to the electrocaloric element along the second thermal flow path.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

The FIGURE is a schematic depiction of an example embodiment of heat transfer system comprising an electrocaloric element and other components.

DETAILED DESCRIPTION

As mentioned above, a method of making an electrocaloric element comprises forming conductive layers on opposing surfaces of a film comprising an electrocaloric material. In some embodiments, electrocaloric film thickness can be in a range from having a lower limit of 0.1 μm, more specifically 0.5 μm, and even more specifically 1 μm. In some embodiments, the film thickness range can and having an upper limit of 1000 μm, more specifically 100 μm, and even more specifically 10 μm. Examples of electrocaloric materials for the electrocaloric film can include but are not limited to inorganic materials and electrocaloric polymers. Examples of inorganics include but are not limited to $PbTiO_3$ ("PT"), $Pb(Mg_{1/3}Nb_{2/3})O_3$ ("PMN"), PMN-PT, $LiTaO_3$, barium strontium titanate (BST) or PZT (lead, zirconium, titanium, oxygen). Examples of electrocaloric polymers include, but are not limited to ferroelectric polymers, liquid crystal polymers, and liquid crystal elastomers.

Ferroelectric polymers are crystalline polymers, or polymers with a high degree of crystallinity, where the crystalline alignment of polymer chains into lamellae and/or spherulite structures can be modified by application of an electric field. Such characteristics can be provided by polar structures integrated into the polymer backbone or appended to the polymer backbone with a fixed orientation to the backbone. Examples of ferroelectric polymers include polyvinylidene fluoride (PVDF), polytriethylene fluoride, odd-numbered nylon, copolymers containing repeat units derived from vinylidene fluoride, and copolymers containing repeat units derived from triethylene fluoride. Polyvinylidene fluoride and copolymers containing repeat units derived from vinylidene fluoride have been widely studied for their ferroelectric and electrocaloric properties. Examples of vinylidene fluoride-containing copolymers include copolymers with methyl methacrylate, and copolymers with one or more halogenated co-monomers including but not limited to trifluoroethylene, tetrafluoroethylene, chlorotrifluoroethylene, trichloroethylene, vinylidene chloride, vinyl chloride, and other halogenated unsaturated monomers.

Liquid crystal polymers, or polymer liquid crystals comprise polymer molecules that include mesogenic groups. Mesogenic molecular structures are well-known, and are often described as rod-like or disk-like molecular structures having electron density orientations that produce a dipole moment in response to an external field such as an external electric field. Liquid crystal polymers typically comprise numerous mesogenic groups connected by non-mesogenic molecular structures. The non-mesogenic connecting structures and their connection, placement and spacing in the polymer molecule along with mesogenic structures are important in providing the fluid defoiiiiable response to the external field. Typically, the connecting structures provide stiffness low enough so that molecular realignment is induced by application of the external field, and high enough to provide the characteristics of a polymer when the external field is not applied.

In some exemplary embodiments, a liquid crystal polymer can have rod-like mesogenic structures in the polymer backbone separated by non-mesogenic spacer groups having flexibility to allow for re-ordering of the mesogenic groups in response to an external field. Such polymers are also known as main-chain liquid crystal polymers. In some exemplary embodiments, a liquid crystal polymer can have rod-like mesogenic structures attached as side groups attached to the polymer backbone. Such polymers are also known as side-chain liquid crystal polymers.

Examples of main-chain liquid crystal polymers include those having the repeating structures shown with $C_{10}$ and $C_8$ polyethylene spacer groups, respectively:

(1)

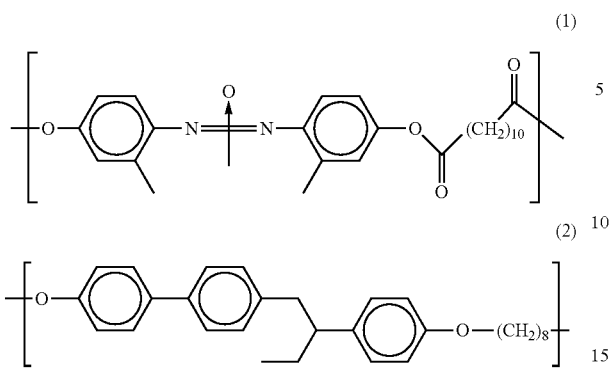

(2)

Examples of side-chain liquid crystal polymers include those having the repeating structures shown with $C_4$ and $C_{10}$ polyethylene spacer groups, respectively:

(3)

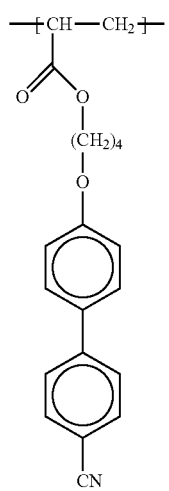

(4)

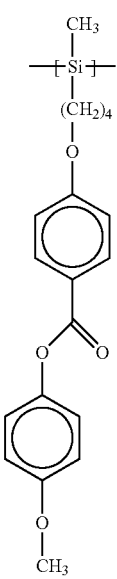

(5)

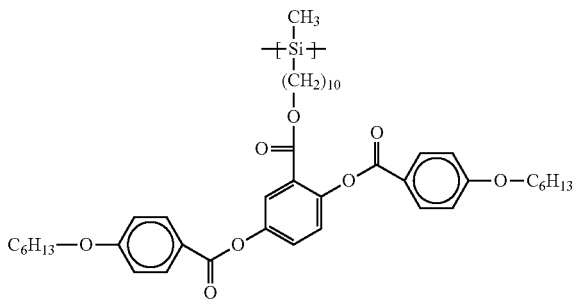

Of course, the above structures are exemplary. Many other liquid crystal polymers are known, and can be readily utilized by the skilled person.

In some embodiments liquid crystal elastomers can be based on liquid crystal polymers that have been modified with crosslinking. The crosslink density can be adjusted to be low enough so that local molecular flexibility is retained to allow nematic or smectic ordering of the mesogenic groups in response to an external field. However, the crosslink density can be set high enough to produce a macro elastic deformation response of the polymer to the external field instead of the Brownian molecular motion that results in a fluid, non-elastic macro response to the external field. The crosslinking reaction can rely on any type of crosslinking mechanism such as including tri- or higher-functional monomer in the monomer reactants during polymerization or by including functional side groups such as hydroxyl attached to the polymer chain, which can be reacted with a crosslinking agent such as a diisocyanate. The functional side groups can be selected to result in a mesogenic group integrated in the crosslink chain, or the mesogenic groups can be attached as side groups on the polymer chain separate from crosslink chains that are non-mesogenic. Many liquid crystal elastomers are known, and can be readily utilized by the skilled person.

In some embodiments, conductive layers are formed on opposing surfaces of the film to form an electrocaloric element by vapor deposition of conductive layers. Metals for vapor deposition can include aluminum, aluminum alloys (e.g., those formed from aluminum and any of the following: silicon, chromium, and titanium), as well as alloys formed from copper, nickel, chromium, zinc, silver, gold, combinations thereof, and other conductive metals. In some embodiments, vapor deposited electrodes can range in thickness from 10 nm to 200 nm. Vapor deposition techniques can include physical vapor deposition or chemical vapor deposition techniques. Examples of physical vapor deposition techniques include but are not limited to sputtering, where a target material is subject to a plasma discharge that is magnetically localized around or focused toward the target, causing some of the target to be ejected as a vapor and deposited onto the film. Electron beam physical vapor deposition can also be used, where a metal target as anode is bombarded with an electron beam given off by a charged tungsten filament under a vacuum, causing vaporization of the target material and coating metal onto the film also positioned in the vacuum chamber. Pulsed laser deposition (PLD) bombards a target in a vacuum chamber with high-powered laser pulses, resulting in a vaporized plasma plume from the target being deposited onto the film. Other techniques such as cathodic arc deposition or evaporative deposition can also be used. Chemical vapor deposition (CVD) techniques can also be used for depositing metal layers (e.g., aluminum, copper), conductive carbon layers such as graphene or carbon nanotubes, or semiconductors (e.g., polysilicon) that can be doped to provide the electrical conductivity needed for electrodes.

In some embodiments, a vapor deposition technique involving reduced pressure (e.g., electron beam physical vapor deposition, sputtering, pulsed laser deposition) is maintained under reduced pressure for a duration of time, wherein the duration of time under reduced pressure is less than 240 minutes. In some embodiments, the duration of time under reduced pressure is less than 60 minutes. In some embodiments, the duration of time under reduced pressure is less than 30 minutes. In some embodiments, the duration of time under reduced pressure is less than 10 minutes. In some embodiments, the duration of time under reduced pressure is less than 5 minutes. Minimum times under reduced pressure needed for meaningful deposition of conductive electrodes to occur can be 0.01 milliseconds, more specifically 0.1 milliseconds, especially if the deposition is done in either a continuous manner with the film passing through successive load locks or alternatively in a roll-to-roll configuration. It is understood that the above upper and lower limits for duration of time can be independently combined, yielding a number of different ranges. In some embodiments, limiting the duration of time under reduced pressure can mitigate induced porosity in underlying electrocaloric films such as electrocaloric polymers.

In some embodiments, a vapor deposition technique comprises limiting a duration of time of exposure of the electrocaloric film to vaporized conductive material to less than 600 seconds. In some embodiments, the duration of time of exposure to vaporized conductive material is less than 240 minutes. In some embodiments, the duration of time of exposure to vaporized conductive material is less than 60 minutes. In some embodiments, the duration of time of exposure to vaporized conductive material is less than 30 minutes. In some embodiments, the duration of time of exposure to vaporized conductive material is less than 10 minutes. In some embodiments, the duration of time of exposure to vaporized conductive material is less than 5 minutes. In some embodiments, the duration of time of exposure to vaporized conductive material is less than 2 minutes. Minimum times of exposure to vaporized conductive material or other conductors needed for meaningful deposition to occur can be 0.01 milliseconds, more specifically 0.1 milliseconds, especially if the deposition is done in either a continuous manner with the film passing through successive load locks or alternatively in a roll-to-roll configuration. It is understood that the above upper and lower limits for duration of time of exposure to vaporized conductive material can be independently combined, yielding a number of different ranges. In some embodiments, limiting the duration of time of exposure of the electrocaloric film to vaporized conductive material can limit thermal degradation of an electrocaloric polymer crystal structure and its concomitant degradation of electrocaloric properties.

In some embodiments, vapor deposition of conductive material under reduced pressure can be performed under reduced pressure in a specified range. Vapor deposition techniques under reduced pressure can be performed under a pressure ranging from $10^{-8}$ torr on the low end, more specifically $10^{-7}$ torr, and even more specifically $10^{-6}$ torr. On the high end of the range, the pressure can be 500 torr, more specifically 200 torr, and even more specifically 100 torr. It is understood that the above upper and lower limits for pressure can be independently combined, yielding a number of different ranges. In some embodiments, maintaining pressure above the low end of any of these ranges can mitigate induced porosity in underlying electrocaloric films such as electrocaloric polymers. In some embodiments, maintaining pressure below the high end of any of these ranges can provide reduced temperatures needed for vapor deposition, thus limiting thermal degradation of an electrocaloric polymer crystal structure and its concomitant degradation of electrocaloric properties.

In some embodiments, the electrocaloric film can be kept at a temperature below 200° C. during vapor deposition, more specifically below 100° C., even more specifically below 50° C., and even more specifically below 20° C. In addition to the above-described techniques such as limiting the high end of a reduced pressure range or limiting a duration of time of exposure to vaporized conductive material, other temperature management techniques can be used, including but not limited to maintaining the film in contact with a solid heat sink support on the opposite side of the film from the side exposed to vaporized conductive material during vapor deposition, or directing a relatively cool air stream onto the opposite side of the film from the side exposed to vaporized conductive material during vapor deposition. Of course, the temperature of the film does not need to be maintained unnecessarily cool, and minimum temperatures during vapor deposition are typically above 0° C.

Techniques other than vapor deposition can also be used to avoid excessive temperature rise in the electrocaloric film during application of the electrodes. For example, the surface of the electrocaloric film can be doped with a conductive materials such as metal atoms or salts, or the film can be fabricated with a concentration near the film surface of a conductive filler such as carbon nanotubes, graphene nanoplatelets, or conductive metal nanoparticles. Alternatively, the electrocaloric film can be coated or laminated with a surface layer of conductive polymer such as polyaniline.

An example embodiment of a heat transfer system and its operation are further described with respect to the FIGURE. As shown in the FIGURE, a heat transfer system 310 comprises an electrocaloric element comprising an electrocaloric film 312 having electrodes 314 and 316 on opposite sides thereof. Multiple electrocaloric elements configured in a stack can also be used. In some embodiments, space between adjacent electrocaloric elements in a stack can be in a range from having a lower limit of 1 μm, more specifically 10 μm, and even more specifically 50 μm. In some embodiments, the separation range can and having an upper limit of 200 mm, more specifically 10 mm, even more specifically 2 mm. The electrocaloric element is in thermal communication with a heat sink 317 through a first thermal flow path 318, and in thermal communication with a heat source 320 through a second thermal flow path 322. The thermal flow paths are described below with respect thermal transfer through flow of a heat transfer fluid through control valves 326 and 328 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 324 is configured to control electrical current to through a power source (not shown) to selectively activate the electrodes 314, 316. The controller 324 is also configured to open and close control valves 326 and 328 to selectively direct the heat transfer fluid along the first and second flow paths 318 and 322.

In operation, the system 310 can be operated by the controller 324 applying an electric field as a voltage differential across the electrocaloric element to cause a decrease in entropy and a release of heat energy by the electrocaloric elements. The controller 324 opens the control valve 326 to transfer at least a portion of the released heat energy along flow path 318 to heat sink 317. This transfer of heat can occur after the temperature of the electrocaloric elements has risen to a threshold temperature. In some embodiments, heat transfer to the heat sink 317 is begun as soon as the temperature of the electrocaloric elements increases to be about equal to the temperature of the heat sink 317. After application of the electric field for a time to induce a desired release and transfer of heat energy from the electrocaloric elements to the heat sink 317, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 320. The controller 324 closes control valve 326 to terminate flow along flow path 318, and opens control device 328 to transfer heat energy from the heat source 320 to the colder electrocaloric elements in order to regenerate the electrocaloric elements for another cycle.

In some embodiments, for example where a heat transfer system is utilized to maintain a temperature in a conditioned space or thermal target, the electric field can be applied to the electrocaloric elements to increase its temperature until the temperature of the electrocaloric element reaches a first threshold. After the first temperature threshold, the controller 324 opens control valve 326 to transfer heat from the electrocaloric elements to the heat sink 317 until a second temperature threshold is reached. The electric field can continue to be applied during all or a portion of the time period between the first and second temperature thresholds, and is then removed to reduce the temperature of the electrocaloric elements until a third temperature threshold is reached. The controller 324 then closes control valve 326 to terminate heat flow transfer along heat flow path 318, and opens control valve 328 to transfer heat from the heat source 320 to the electrocaloric elements. The above steps can be optionally repeated until a target temperature of the conditioned space or thermal target (which can be either the heat source or the heat sink) is reached.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A method of making an electrocaloric element, comprising
forming a film comprising an electrocaloric polymer;
forming conductive layers on opposing surfaces of the film, wherein the forming of the conductive layers includes vapor deposition of the conductive layers under reduced pressure, wherein the reduced pressure is $10^{-8}$ torr to 500 torr:
wherein (i) the vapor deposition of the conductive layers under the reduced pressure occurs for a duration of time, wherein the duration of time under the reduced pressure is less than 240 minutes or (ii) the vapor deposition of the conductive layers under the reduced pressure for a duration of time, wherein the duration of time of exposure to conductive material deposition is less than 240 minutes;
establishing and maintaining the film at a temperature of less than or equal to 100° C. during forming of the conductive layers;
wherein the conductive layers comprise aluminum or alloys of aluminum and at least one other metal comprising silicon, chromium, or titanium;
wherein the conductive layers range in thickness from 10 nm to 200 nm.

2. The method of claim 1, wherein the forming of the conductive layers comprises vapor deposition of the conductive layers under the reduced pressure for a duration of time, wherein the duration of time under the reduced pressure is less than 240 minutes.

3. The method of claim 2, wherein the duration of time under the reduced pressure is less than 30 minutes.

4. The method of claim 2, wherein the duration of time under the reduced pressure is less than 10 minutes.

5. The method of claim 1, wherein the forming of the conductive layers comprises vapor deposition of the conductive layers under the reduced pressure for a duration of time, wherein the duration of time of exposure to conductive material deposition is less than 240 minutes.

6. The method of claim 5, wherein the duration of time of exposure to conductive material deposition is less than 30 minutes.

7. The method of claim 5, wherein the duration of time of exposure to conductive material deposition is less than 10 minutes.

8. The method of claim 1, wherein the reduced pressure is less than 200 torr.

9. The method of claim 1, wherein the reduced pressure is less than 100 torr.

10. The method of claim 1, wherein the film is maintained at a temperature of less than or equal to 50° C. during forming of the conductive layers.

11. The method of claim 1, wherein the film is maintained at a temperature of less than or equal to 20° C. during forming of the conductive layers.

12. The method of claim 1, A method of making an electrocaloric element, comprising
forming a film comprising an electrocaloric polymer;
forming conductive layers on opposing surfaces of the film, wherein the forming of the conductive layers includes vapor deposition of the conductive layers under reduced pressure, wherein the reduced pressure is $10^{-8}$ torr to 500 torr:
wherein (i) the vapor deposition of the conductive layers under the reduced pressure occurs for a duration of time, wherein the duration of time under the reduced pressure is less than 240 minutes or (ii) the vapor deposition of the conductive layers under the reduced pressure for a duration of time, wherein the duration of time of exposure to conductive material deposition is less than 240 minutes;

establishing and maintaining the film at a temperature of less than or equal to 100° C. during forming of the conductive layers;

wherein the conductive layers comprise aluminum or alloys of aluminum and at least one other metal comprising silicon, chromium, or titanium;

wherein the conductive layers range in thickness from 10 nm to 200 nm, wherein the film is in thermal contact with a heat sink support on a first side of the film during forming of the conductive layers on second side of the film, the first side opposite the second side.

* * * * *